(12) United States Patent
Wu et al.

(10) Patent No.: US 10,096,626 B2
(45) Date of Patent: Oct. 9, 2018

(54) PIXEL ARRAY

(71) Applicant: E Ink Holdings Inc., Hsinchu (TW)

(72) Inventors: Ni-Yeh Wu, Hsinchu (TW); Po-Chun Chuang, Hsinchu (TW); Pei-Lin Huang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/678,101

(22) Filed: Aug. 15, 2017

(65) Prior Publication Data
US 2018/0130825 A1 May 10, 2018

(30) Foreign Application Priority Data
Nov. 10, 2016 (CN) .......................... 2016 1 0988341

(51) Int. Cl.
H01L 27/12 (2006.01)
(52) U.S. Cl.
CPC .................. H01L 27/124 (2013.01)
(58) Field of Classification Search
CPC ... G09G 2300/0426; G09G 2300/0439; G09G 2300/08; G09G 3/2092; H01L 27/124; G02F 1/136286
USPC .......................................................... 257/72
See application file for complete search history.

(56) References Cited

U.S. PATENT DOCUMENTS

| 6,376,270 B1 | 4/2002 | Gu et al. |
| 6,583,471 B1 | 6/2003 | Yamazaki et al. |
| 7,023,407 B2 | 4/2006 | Nakanishi |
| 7,745,830 B2 | 6/2010 | Gu et al. |
| 2011/0305882 A1* | 12/2011 | Kim .................... H01L 27/1214 428/195.1 |
| 2015/0214246 A1* | 7/2015 | Wu ........................ H01L 27/124 257/347 |

FOREIGN PATENT DOCUMENTS

| CN | 101488504 A | 7/2009 |
| TW | 200844618 A | 11/2008 |
| TW | 201530240 A | 8/2015 |
| TW | 201530522 A | 8/2015 |

OTHER PUBLICATIONS

Corresponding Taiwanese office action dated Jul. 11, 2017.

* cited by examiner

*Primary Examiner* — Caleen Sullivan
(74) *Attorney, Agent, or Firm* — CKC & Partners Co., Ltd.

(57) ABSTRACT

A pixel array includes first signal lines, second signal lines, active elements, pixel electrodes, and selection lines. The second signal lines are intersected with and electrically insulated to the first signal lines to define pixel regions. The active element and the pixel electrode are disposed in the pixel regions. The active elements are electrically connected to the first signal lines and the second signal lines. The pixel electrodes are electrically connected to the active elements. The selection lines are disposed over the first signal lines and intersected with the first signal lines to form first intersections and second intersections. The selection lines are electrically connected to the first signal lines at the first intersections and electrically insulated to the first signal lines at the second intersections. The selection lines and the pixel electrodes are leveled. The selection lines are electrically insulated to the second signal lines.

10 Claims, 6 Drawing Sheets

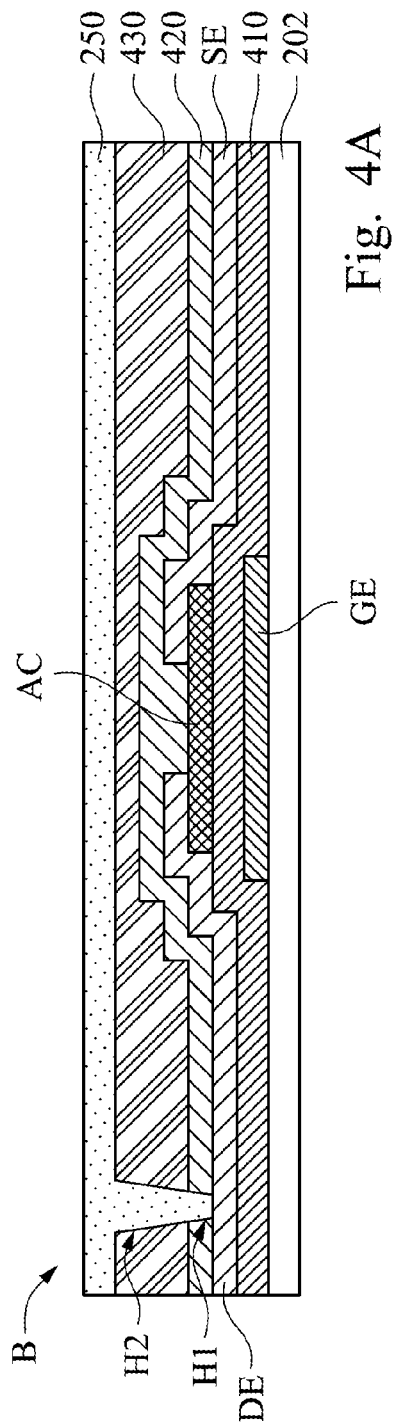
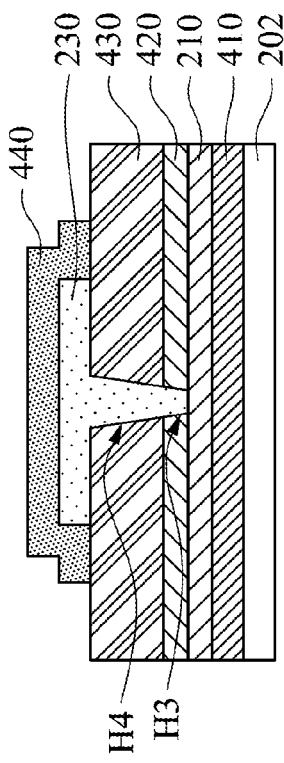
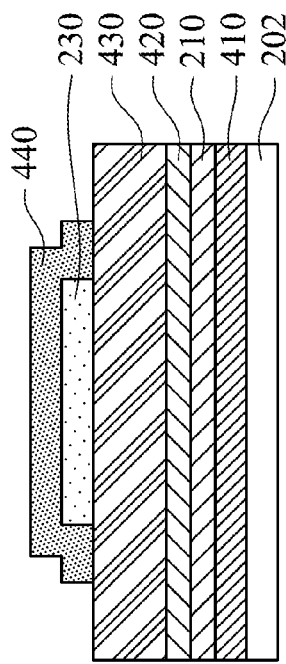
Fig. 4A
Fig. 4B
Fig. 4C

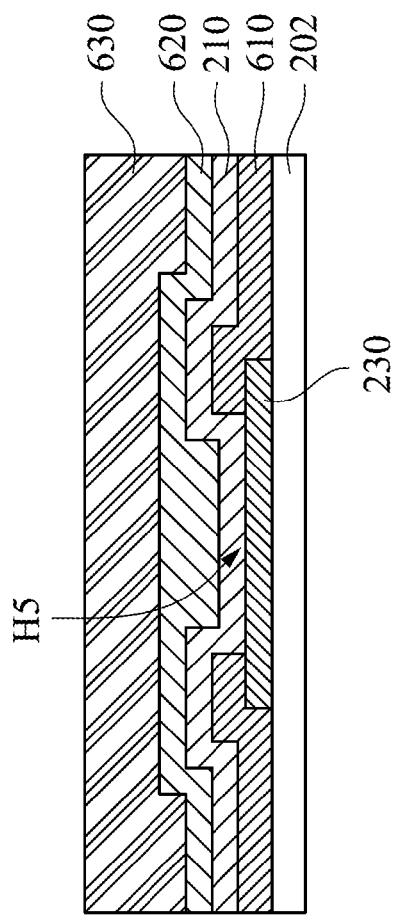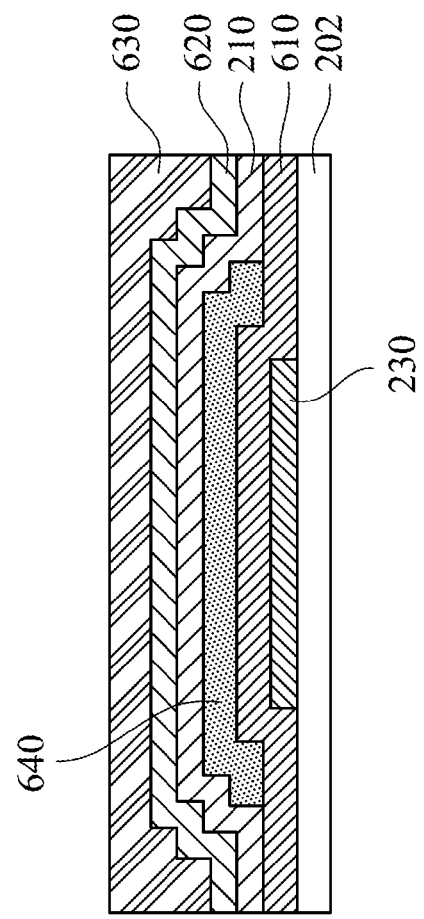

PIXEL ARRAY

CROSS-REFERENCE TO RELATED APPLICATION

This application claims priority to China Application Serial Number 201610988341.3, filed Nov. 10, 2016, the disclosures of which are incorporated herein by reference in their entireties.

BACKGROUND

Field of Invention

The present invention relates to a pixel array. More particularly, the present invention relates to a pixel array which can satisfy the requirement of the narrow border design.

Description of Related Art

With the rapid development of display techniques, display panels have been widely used in various display devices, e.g. televisions, laptops, tablet computers, electronic paper (e-paper) and mobile phones. Among lots of factors affecting the customers' buying choices of display devices, besides the performance of the display devices, the external designs of the display devices also significantly influences purchase intentions of the customers. Therefore, display panel related industries are moving forward with the goal of designing narrow border display panels.

Often the requirement of the narrow border design can be achieved through decreasing the covered region, which is used to hide the wire routing, around the visible screen, and simultaneously increasing the area of the visible screen. As shown in FIG. 1, which is a partial diagram of a conventional pixel array, a first signal line 110 is intersected with a second signal line 120, and also intersected with a first selection line 130a and a second selection line 130b to form a first intersection a1 and a second intersection a2. The first signal line 110 is electrically connected to the first selection line 130a at the first intersection a1; therefore, signals from an outer signal source can be conveyed to the first signal line 110 through the first selection line 130a. As a result, the second selection line 130b is unnecessary to be electrically connected to the first signal line 110, but the second selection line 130b can be electrically connected to another first signal line at other places, leading to the second selection line 130b being electrically insulated to the first signal line 110 at the second intersection a2. When the second signal line 120 is connected to a signal source (not shown here), which is above or below FIG. 1, the first signal line 110 can be also connected to the signal source through the first selection line 130a. This wire routing replaces the traditional design that the first signal line 110 is required to wire the signal source through the left or right side of FIG. 1. Thus, the design of narrow border can be achieved by applying the pixel array in FIG. 1.

However, since the second selection line 130b is electrically insulated to the first signal line 110, larger stray capacitance is easily engendered between these two lines when the thickness of the insulating layer separating the second selection line 130b from the first signal line 110 is insufficient, further affecting the display function of the display panel. In the light of this, a novel pixel array is required to solve the problem mentioned above.

SUMMARY

The present disclosure provides a pixel array. The pixel array includes a plurality of first signal lines, a plurality of second signal lines, a plurality of active elements, a plurality of pixel electrodes, and a plurality of selection lines. The second signal lines are intersected with the first signal lines to define a plurality of pixel regions and electrically insulated to the first signal lines. Each active element is disposed in one of the pixel regions and electrically connected to one of the first signal lines and one of the second signal lines. Each pixel electrode is disposed in one of the pixel regions and electrically connected to one of the active elements. The selection lines are disposed over the first signal lines and intersected with the first signal lines to form a plurality of first intersections and a plurality of second intersections. The selection lines are electrically connected to the first signal lines at the first intersections and electrically insulated to the first signal lines at the second intersections. The selection lines and the pixel electrodes are leveled. The selection lines are electrically insulated to the second signal lines.

In one embodiment of the present disclosure, the pixel array further includes a protective layer disposed between the selection lines and the first signal lines, wherein the selection lines are electrically insulated to the first signal lines by the protective layer at the second intersections.

In one embodiment of the present disclosure, the pixel array further includes a first insulating layer disposed between the protective layer and the selection lines, wherein the selection lines are electrically insulated to the first signal lines by the protective layer and the first insulating layer at the second intersections.

In one embodiment of the present disclosure, the pixel array further includes a second insulating layer on the selection lines.

In one embodiment of the present disclosure, a material of the selection lines is same as a material of the pixel electrodes.

In one embodiment of the present disclosure, the first signal lines are data lines, and the second signal lines are scan lines.

The present disclosure provides a pixel array. The pixel array includes a plurality of first signal lines, a plurality of second signal lines, a plurality of active elements, a plurality of pixel electrodes, and a plurality of selection lines, an insulating layer, and a photoresist layer. The second signal lines are intersected with the first signal lines to define a plurality of pixel regions and electrically insulated to the first signal lines. Each active element is disposed in one of the pixel regions and electrically connected to one of the first signal lines and one of the second signal lines. Each pixel electrode is disposed in one of the pixel regions and electrically connected to one of the active elements. The selection lines are disposed under the first signal lines and intersected with the first signal lines to form a plurality of first intersections and a plurality of second intersections. The selection lines are electrically connected to the first signal lines at the first intersections, electrically insulated to the first signal lines at the second intersections, and electrically insulated to the second signal lines. The insulating layer is disposed between the selection lines and the first signal lines. The photoresist layer is disposed between the insulating layer and the first signal lines.

In one embodiment of the present disclosure, a material of the selection lines is same as a material of the second selection lines.

In one embodiment of the present disclosure, the selection lines and the second signal lines are leveled.

In one embodiment of the present disclosure, the first signal lines are data lines, and the second signal lines are scan lines.

BRIEF DESCRIPTION OF THE DRAWINGS

The invention can be more fully understood by reading the following detailed description of the embodiment, with reference made to the accompanying drawings as follows:

FIG. 4A is a cross sectional diagram along the section line A-A' in FIG. 3.

FIG. 4B is a cross sectional diagram along the section line B-B' in FIG. 3.

FIG. 4C is a cross sectional diagram along the section line C-C' in FIG. 3.

FIG. 6A is a cross sectional diagram along the section line D-D' in FIG. 5.

FIG. 6B is a cross sectional diagram along the section line E-E' in FIG. 5.

DETAILED DESCRIPTION

Figure 2:
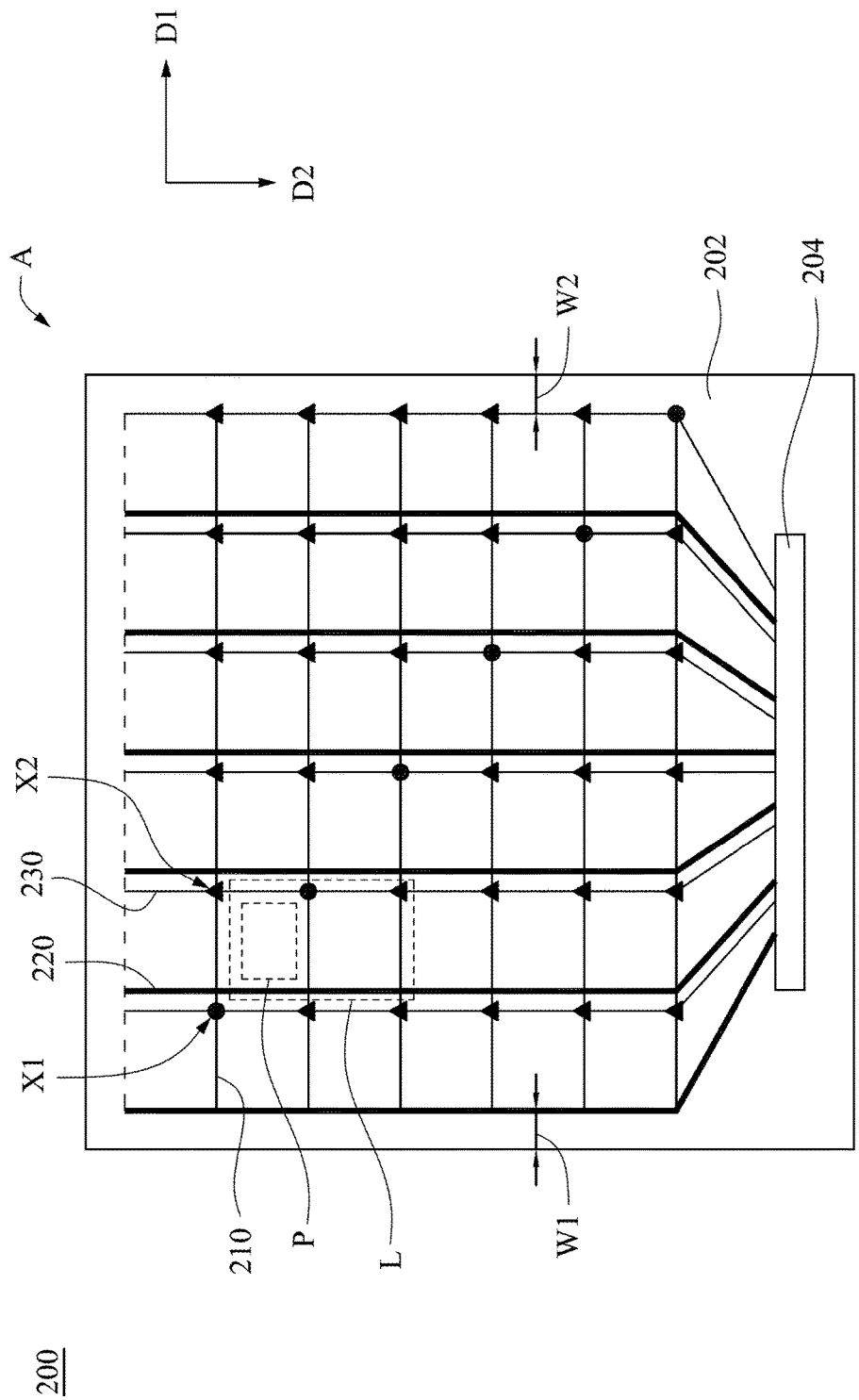
FIG. 2 is a top view diagram of a pixel array substrate according to one embodiment of the present disclosure.
Figure 3:
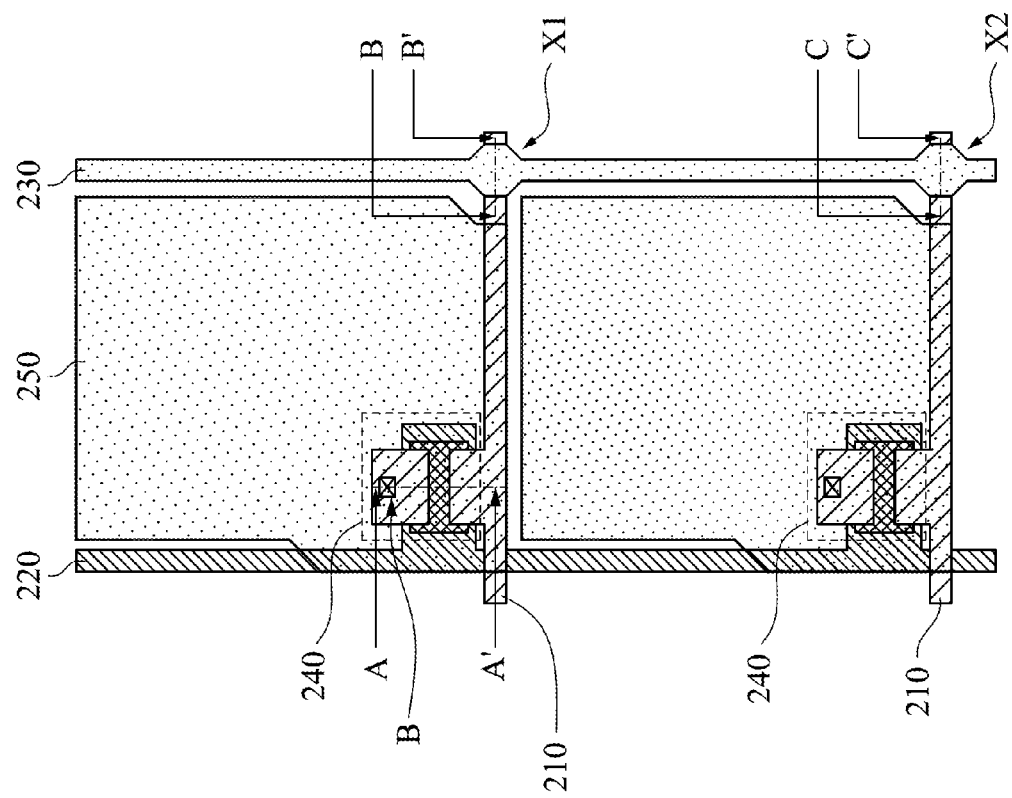
FIG. 3 is an enlarged diagram of a kind of pixel array in the region L in FIG. 2.

FIG. 2 is a top view diagram of a pixel array substrate according to an embodiment of the present disclosure. FIG. 3 is an enlarged diagram of a kind of pixel array in the region L in FIG. 2. Please refer to FIG. 2 and FIG. 3. A pixel array substrate 200 includes a substrate 202, a driving unit 204 and a pixel array A. The pixel array A includes a plurality of first signal lines 210, a plurality of second signal lines 220, a plurality of selection lines 230, a plurality of active elements 240 and a plurality of pixel electrodes 250. The pixel array A and the driving unit 204 are both disposed on the substrate 202. Besides, these second signal lines 220 and selection lines 230 extend from the pixel array A, and are electrically connected to the driving unit 204, conveying signals from the driving unit 204.

In the pixel array A, the first signal lines 210 extend along a first direction D1 and are arranged along a second direction D2. On the other hand, the second signal lines 220 extend along the second direction D2 and are arranged along the first direction D1. In one embodiment, the first direction D1 is perpendicular to the second direction D2, but other general cases are also applicable. The first signal lines 210 are intersected with and electrically insulated to the second signal lines 220 to define a plurality of pixel regions P. Each active element 240 is disposed in one of the pixel regions P, and electrically connected to one of the first signal lines 210 and one of the second signal lines 220.

Figure 1:
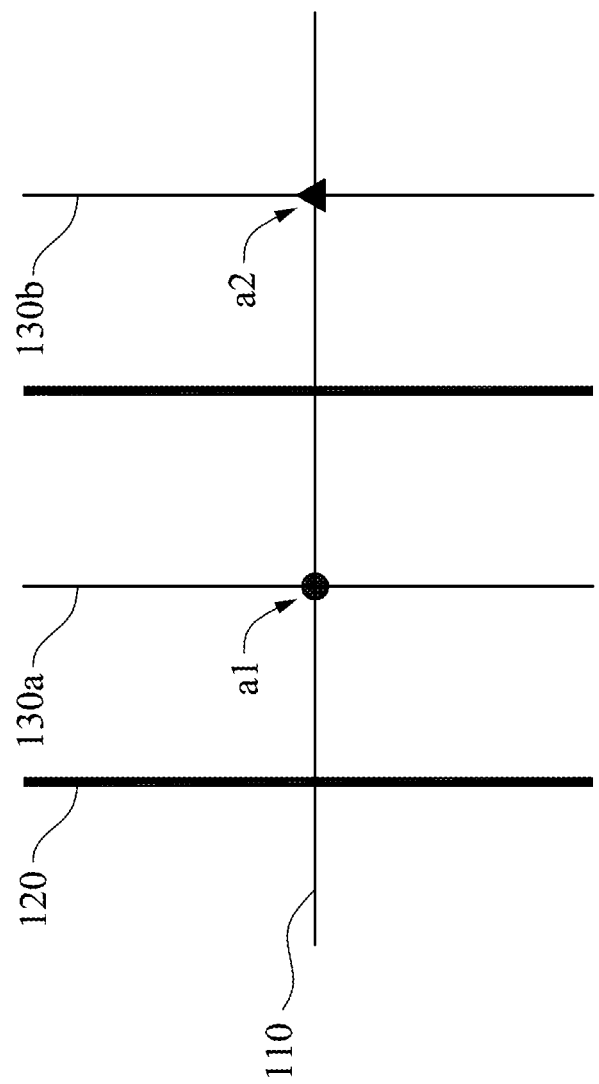
FIG. 1 is a partial diagram of a conventional pixel array.

Please refer to FIG. 2 and FIG. 3. The selection lines 230 extend along the second direction D2 and are arranged along the first direction D1. The selection lines 230 are disposed over the first signal lines 210 and intersected with the first signal lines 210 to form a plurality of first intersections X1 and a plurality of second intersections X2. The selection lines 230 are electrically connected to the first signal lines 210 at the first intersections X1, conveying signals from the driving unit 204 to the first signal lines 210. On the other hand, the selection lines 230 are electrically insulated to the first signal lines 210 at the second intersections X2. Furthermore, the selection lines 230 are electrically insulated to the second signal lines 220. It should be noted that the second signal lines 220 and the selection lines 230 can be wired from the same side of the pixel array A to the driving unit 204. As a result, compared to traditional structure designs which do not include selection lines and consequently enforce the first signal lines to be wired to a driving unit through either side of the pixel array, the widths of the border, W1 and W2, of the pixel array in the present disclosure as shown in FIG. 1 can be decreased, achieving designs of narrow border.

Next, please refer to FIG. 3 and FIG. 4A. FIG. 4A is a cross sectional diagram along the section line A-A' in FIG. 3. The active element 240 includes a gate electrode GE, an active layer AC, a source electrode SE and a drain electrode DE. The gate electrode GE is disposed on the substrate 202. The active layer AC is disposed on the gate electrode GE. The source electrode SE and the drain electrode DE are disposed on the active layer AC. The pixel array A can further include a protective layer 420 and a first insulating layer 430. The drain electrode DE can be electrically connected to the pixel electrode 250 through the opening H1 of the protective layer 420 and the opening H2 of the first insulating layer 430. The pixel array A can further include a third insulating layer 410 between the gate electrode GE and the active layer AC, and the third insulating layer 410 covers the gate electrode GE and the substrate 202. In FIG. 3, a connection B is utilized to illustrate the position of electrically connection between the drain electrode DE and the pixel electrode 250.

In the FIG. 3, the first signal line 210 is electrically connected to the source electrode SE, and the second signal line 220 is electrically connected to the gate electrode GE; therefore, the first signal line 210 is a data line, and the second signal line 220 is a scan line. The first signal line 210 is electrically connected to the selection line 230, conveying signals from the driving unit 204 to the source electrode SE. Nonetheless, in another embodiment, the source electrode of the active element is electrically connected to the second signal line 220, and the gate electrode of the active element is electrically connected to the first signal line 210. As a result, in this embodiment, the first signal line 210 is a scan line, and the second signal line 220 is a data line. The first signal line 210 is electrically connected to the selection line 230, conveying signals from the driving unit 204 to the gate electrode.

Next, please refer to FIG. 3, FIG. 4B and FIG. 4C simultaneously. FIG. 4B is a cross sectional diagram along the section line B-B' in FIG. 3, namely a sectional diagram of the first intersection X1. FIG. 4C is a cross sectional diagram along the section line C-C' in FIG. 3, namely a sectional diagram of the second intersection X2. It should be noted that the selection line 230 is disposed over the first signal line 210.

In FIG. 4B, the multiple layers of the pixel array A at the first intersection X1 include the substrate 202, the third insulating layer 410, the first signal line 210, the protective layer 420, the first insulating layer 430, the selection line 230 and the second insulating layer 440. The third insulating layer 410 is disposed on the substrate 202, the first signal line 210 is disposed on the third insulating layer 410, the protective layer 420 is disposed on the first signal line 210, the first insulating layer 430 is disposed on the protective layer 420, the selection line 230 is disposed on the first insulating layer 430, and the second insulating layer 440 is disposed on the selection line 230. The protective layer 420 has an opening H3 corresponding to the first intersection X1, and the first insulating layer 430 has an opening H4 corresponding to the first intersection X1. The selection line 230 is in contact with and electrically connected to the first signal line 210 through the opening H3 of the protective layer 420 and the opening H4 of the first insulating layer 430.

In FIG. 4C, the multiple layers of the pixel array A at the second intersection X2 include the substrate 202, the third insulating layer 410, the first signal line 210, the protective layer 420, the first insulating layer 430, the selection line 230 and the second insulating layer 440. The third insulating layer 410 is disposed on the substrate 202, the first signal line 210 is disposed on the third insulating layer 410, the protective layer 420 is disposed on the first signal line 210, the first insulating layer 430 is disposed on the protective layer 420, the selection line 230 is disposed on the first insulating layer 430, and the second insulating layer 440 is disposed on the selection line 230. The selection line 230 is electrically insulated to the first signal line 210 at the second intersection X2 through the protective layer 420 and the first insulating layer 430. Generally, the protective layer 420 and the first insulating layer 430 are utilized to isolate an active element from other electric elements, avoiding interference between them. Thus, the protective layer 420 and the first insulating layer 430 are often designed to be thicker. For instance, the thickness of the protective layer 420 is about 2000 to 3000 angstrom, and the thickness of the first insulating layer 430 is about 2000 to 3600 angstrom. Hence, there exists insulating materials thick enough between the selection line 230 and the first signal line 210 of the present disclosure for decreasing the stray capacitance (also known as the parasitic capacitance) between them as far as possible, further providing excellent performance of the pixel array in the present disclosure. Besides, according to different design requirements, the thicknesses of the protective layer 420 and the first insulating layer 430 can be adjusted to optimize the effectiveness of decreasing the stray capacitance.

In one embodiment, the material of the protective layer 420 could be any suitable insulating materials, including but not limited to silicon monoxide (SiO), silicon dioxide ($SiO_2$), silicon nitride ($Si_3N_4$), silicon oxynitride ($SiO_xN_y$), aluminum oxide ($Al_2O_3$), aluminum nitride (AlN), aluminum oxynitride (AlON) or a combination thereof. The material of the first insulating layer 430 could be any suitable photoresist materials, including but not limited to poly(p-hydroxystyrene), polyacrylate or a combination thereof.

In another embodiment, the first insulating layer 430 of the pixel array A could be omitted. Therefore, the selection lines 230 are electrically insulated to the first signal lines 210 at these second intersections X2 by the protective layer 420. Nevertheless, according different design requirements, the thickness of the protective layer 420 in the present disclosure could be adjusted to optimize the effectiveness of decreasing the stray capacitance.

Please refer to FIG. 4A and FIG. 4C simultaneously. The pixel electrode 250 and the selection line 230 are located on the first insulating layer 430. As a result, the selection line 230 and the pixel electrode 250 are leveled. In one embodiment, a metal layer can be formed on the first insulating layer 430, and the metal layer could be subsequently patterned to form the selection line 230 and the pixel electrode 250. Thus, the material of the selection line 230 is same as the material of the pixel electrode 250.

Moreover, the pixel array substrate 200 of the present disclosure can be applied to various display devices. For example, the pixel array substrate 200 can be used as an active array substrate of an e-paper display. When the electrical ink display layer (not shown) of the e-paper display is attached onto the pixel array substrate 200, the second insulating layer 440 can insulate the electrical ink display layer from the selection line 230. However, when the pixel array substrate 200 is applied to other display devices, the second insulating layer 440, according to different design requirement, can be omitted.

Figure 5:
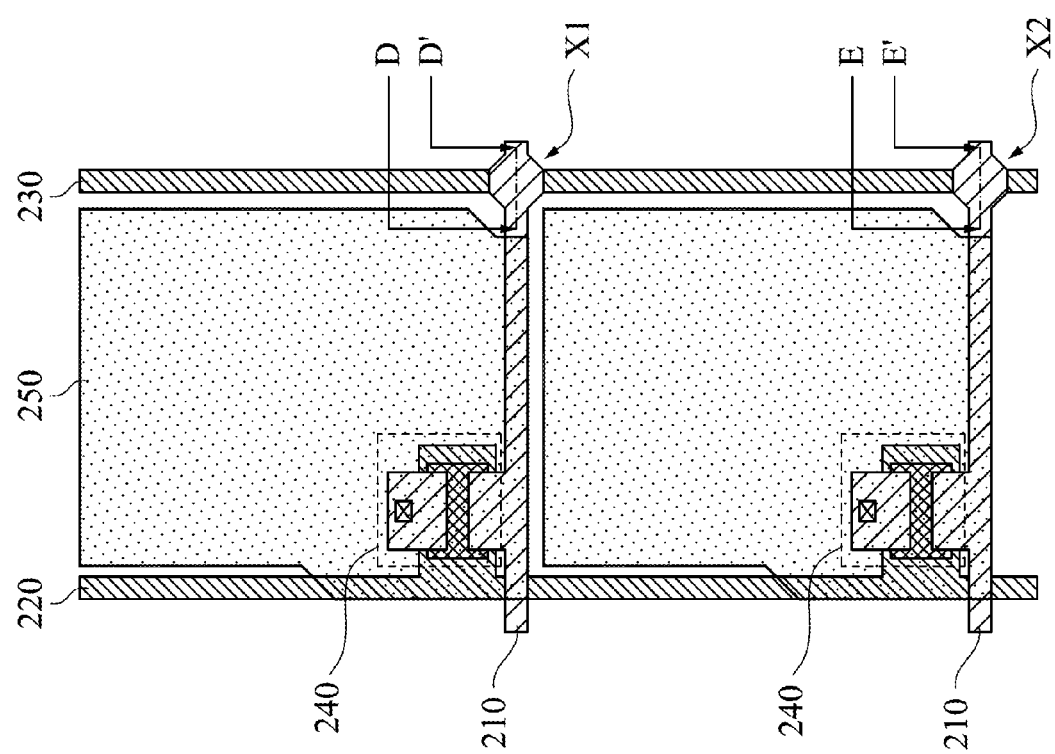
FIG. 5 is an enlarged diagram of another kind of pixel array in the region L in FIG. 2.

Next, please refer to FIG. 5, FIG. 6A and FIG. 6B. FIG. 5 is an enlarged diagram of another kind of pixel array in the region L in FIG. 2. FIG. 6A is a cross sectional diagram along the section line D-D' in FIG. 5, namely a sectional diagram at the first intersection X1. FIG. 6B is a cross sectional diagram along the section line E-E' in FIG. 5, namely a sectional diagram at the second intersection X2. It should be noted that the selection line 230 is disposed under the first signal line 210.

Please refer to FIG. 6A. More specifically, the multiple layers of the pixel array A at the first intersection X1 includes the substrate 202, the selection line 230, the insulating layer 610, the first signal line 210, the protective layer 620 and the insulating layer 630. The selection line 230 is disposed on the substrate 202, and the insulating layer 610 is disposed on the selection line 230. The first signal line 210 is disposed on the insulating layer 610, and is in contact with and electrically connected to the selection line 230 through the opening H5, which corresponds to the first intersection X1, of the insulating layer 610. The protective layer 620 is disposed on the first signal line 210, and the insulating layer 630 is disposed on the protective layer 620.

Please refer to FIG. 6B. More specifically, the multiple layers of the pixel array A at the second intersection X2 include the substrate 202, the selection line 230, the insulating layer 610, the photoresist layer 640, the first signal line 210, the protective layer 620 and the insulating layer 630. The selection line 230 is disposed on the substrate 202, the insulating layer 610 is located on the selection line 230, the photoresist layer 640 is disposed on the insulating layer 610, the first signal line 210 is disposed on the photoresist layer 640, the protective layer 620 is located on the first signal line 210, and the insulating layer 630 is located on the protective layer 620. The selection line 230 is electrically insulated to the first signal line 210 at the second intersection X2 by the insulating layer 610 and the photoresist layer 640. In one embodiment, the photoresist layer 640 could be any suitable photoresist materials, including but not limited to poly(p-hydroxystyrene), polyacrylate, or a combination thereof.

The sectional structure of the active element 240 in FIG. 5 can refer to FIG. 4A. Next, please refer to FIG. 4A and FIG. 6B. It can be seen that the gate electrode GE and the selection line 230 are located on the substrate 202. Since the gate electrode GE is electrically connected to the second signal line 220 and is level with the second signal line 220, the selection line 230 and the second signal line 220 are leveled. In one embodiment, a metal layer can be formed on the substrate 202, and the metal layer could be subsequently patterned to form the gate electrode GE, the second signal line 220 and the selection line 230. Thus, the material of the selection line 230 is same as the second signal line.

Furthermore, according to FIG. 4A and FIG. 6B, the third insulating layer 410 and the insulating layer 610 are leveled. As a result, they can be formed through one fabrication. Since the third insulating layer 410 is a gate insulating layer, dielectric materials with high dielectric constants are often chosen as materials of the third insulating layer 410, also, forming a thickness of only about 400 angstrom. Nonetheless, the pixel array A of the present disclosure includes the photoresist layer 640 disposed between the insulating layer 610 and the first signal line 210, rendering the insulating materials between the selection line 230 and the first signal line 210 in the present disclosure thick enough that the stray capacitance between the two can be decreased as far as possible. Besides, according to different design requirements, the thickness of the photoresist layer 640 in the present disclosure can be adjusted to optimize the effectiveness of decreasing the stray capacitance. For instance, the thickness of the photoresist layer 640 could be, but not limited to, 2000 to 3600 angstrom.

In view of the foregoing, the pixel array of the present disclosure improves the effectiveness of decreasing the stray capacitance between the selection line and the first signal line by utilizing the protective layer and the first insulating layer to separate the selection line from the first signal line, as well as utilizing the insulating layer and the photoresist layer to separate the selection line from the first signal line.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel array, comprising:
   a plurality of first signal lines;
   a plurality of second signal lines intersected with the first signal lines to define a plurality of pixel regions and electrically insulated to the first signal lines;
   a plurality of active elements, each active element disposed in one of the pixel regions and electrically connected to one of the first signal lines and one of the second signal lines;
   a plurality of pixel electrodes, each pixel electrode disposed in one of the pixel regions and electrically connected to one of the active elements;
   a plurality of selection lines disposed over the first signal lines and intersected with the first signal lines to form a plurality of first intersections and a plurality of second intersections, the selection lines electrically connected to the first signal lines at the first intersections and electrically insulated to the first signal lines at the second intersections, and the selection lines electrically insulated to the second signal lines; and
   a protective layer disposed on the active elements and the first signal lines, wherein the selection lines and a portion of each pixel electrode are disposed on the protective layer.

2. The pixel array of claim 1, wherein the selection lines are electrically insulated to the first signal lines by the protective layer at the second intersections.

3. The pixel array of claim 1, further comprising a first insulating layer disposed between the protective layer and the selection lines, wherein the selection lines are electrically insulated to the first signal lines by the protective layer and the first insulating layer at the second intersections.

4. The pixel array of claim 1, further comprising a second insulating layer on the selection lines.

5. The pixel array of claim 1, wherein a material of the selection lines is same as a material of the pixel electrodes.

6. The pixel array of claim 1, wherein the first signal lines are data lines, and the second signal lines are scan lines.

7. A pixel array, comprising:
   a plurality of first signal lines;
   a plurality of second signal lines intersected with the first signal lines to define a plurality of pixel regions and electrically insulated to the first signal lines;
   a plurality of active elements, each active element disposed in one of the pixel regions and electrically connected to one of the first signal lines and one of the second signal lines;
   a plurality of pixel electrodes, each pixel electrode disposed in one of the pixel regions and electrically connected to one of the active elements;
   a plurality of selection lines disposed under the first signal lines and intersected with the first signal lines to form a plurality of first intersections and a plurality of second intersections, the selection lines electrically connected to the first signal lines at the first intersections and electrically insulated to the first signal lines at the second intersections, the selection lines electrically insulated to the second signal lines;
   an insulating layer disposed between the selection lines and the first signal lines; and
   a photoresist layer disposed between the insulating layer and the first signal lines.

8. The pixel array of claim 7, wherein a material of the selection lines is same as a material of the second selection lines.

9. The pixel array of claim 7, wherein the selection lines and the second signal lines are leveled.

10. The pixel array of claim 7, wherein the first signal lines are data lines, and the second signal lines are scan lines.

* * * * *